US009000388B2

(12) United States Patent
Tokura et al.

(10) Patent No.: US 9,000,388 B2
(45) Date of Patent: Apr. 7, 2015

(54) CONNECTION SUBSTRATE

(75) Inventors: Fumiyuki Tokura, Hamamatsu (JP);
Mitsutoshi Sugiya, Hamamatsu (JP);
Shigeru Suzuki, Hamamatsu (JP);
Takashi Tonbe, Hamamatsu (JP)

(73) Assignee: Hamamatsu Photonics K. K.,
Hamamatsu-shi, Shizuoka (JP)

( * ) Notice: Subject to any disclaimer, the term of this patent is extended or adjusted under 35 U.S.C. 154(b) by 0 days.

(21) Appl. No.: 13/640,395

(22) PCT Filed: Jan. 27, 2011

(86) PCT No.: PCT/JP2011/051624
§ 371 (c)(1),
(2), (4) Date: Oct. 10, 2012

(87) PCT Pub. No.: WO2011/129133
PCT Pub. Date: Oct. 20, 2011

(65) Prior Publication Data
US 2013/0032389 A1 Feb. 7, 2013

(30) Foreign Application Priority Data

Apr. 15, 2010 (JP) ................................. 2010-094234

(51) Int. Cl.
*G01T 1/20* (2006.01)
*H01R 13/02* (2006.01)
*H01R 13/46* (2006.01)
*H01L 27/146* (2006.01)
*H05K 1/02* (2006.01)
*H05K 1/11* (2006.01)

(52) U.S. Cl.
CPC ........ *G01T 1/2018* (2013.01); *H01L 27/14623* (2013.01); *H01L 27/14634* (2013.01); *H05K 1/0218* (2013.01); *H05K 1/025* (2013.01); *H01L 27/14661* (2013.01); *H01L 27/14663* (2013.01); *H05K 1/0242* (2013.01); *H05K 1/113* (2013.01);

(Continued)

(58) Field of Classification Search
USPC ...................... 250/370.11; 439/886, 892, 893
See application file for complete search history.

(56) References Cited

U.S. PATENT DOCUMENTS

| 6,510,195 B1* | 1/2003 | Chappo et al. .................. 378/19 |
| 7,675,729 B2* | 3/2010 | Anthony et al. ............... 361/118 |
| 2009/0224162 A1 | 9/2009 | Inuiya et al. |

FOREIGN PATENT DOCUMENTS

| EP | 1615270 | 1/2006 |
| JP | 2003-14862 | 1/2003 |

(Continued)

*Primary Examiner* — David Porta
*Assistant Examiner* — Mindy Vu
(74) *Attorney, Agent, or Firm* — Drinker Biddle & Reath LLP

(57) ABSTRACT

A connection substrate 13 includes a base material 130 formed by stacking a plurality of dielectric layers 130a to 130f and a plurality of through conductors 20 provided penetrating through the dielectric layers 130c to 130f adjacent to each other. A plurality of radiation shielding films 21a to 23a formed integrally with each of the plurality of through conductors 20 and separated from each other are provided at two or more interlayer parts in the dielectric layers 130c to 130f. A region PR1 of the radiation shielding film 21a (21b) formed integrally with one through conductor 20 in one interlayer part projected onto a virtual plane normal to a predetermined direction and a region of the radiation shielding film 22b or 22c (22c) formed integrally with another through conductor 20 in another interlayer part projected onto the virtual plane do not overlap each other. Accordingly, the readout circuits of an integrated circuit device can be protected from radiation, and an increase in parasitic capacitance can be suppressed.

6 Claims, 5 Drawing Sheets

(52) U.S. Cl.
CPC ............... *H05K 2201/09727* (2013.01); *H05K 2201/10545* (2013.01); *H05K 2201/10674* (2013.01)

(56) References Cited

FOREIGN PATENT DOCUMENTS

| JP | 2004-71638  | 3/2004  |
|----|-------------|---------|
| JP | 2004-536313 | 12/2004 |
| JP | 2005-539232 | 12/2005 |
| JP | 2009-32936  | 2/2009  |
| JP | 2009-74964  | 4/2009  |
| JP | 2009-076726 | 4/2009  |
| JP | 2009-212377 | 9/2009  |

\* cited by examiner

CONNECTION SUBSTRATE

TECHNICAL FIELD

The present invention relates to a connection substrate to be used for a radiation detector module.

BACKGROUND ART

Patent Document 1 describes a wiring board for mounting an X-ray detection element in an X-ray detection device. This wiring board includes a base formed by stacking a plurality of insulating layers, a plurality of connection pads formed in an X-ray detection element mounting region of an upper surface of the base, and a plurality of terminal electrodes formed on an outer surface of the base. Also, this wiring board includes a plurality of internal wirings formed inside the base in order to connect the plurality of connection pads and the plurality of terminal electrodes. The plurality of internal wirings include a plurality of through conductors disposed below the mounting region. The plurality of through conductors are formed inclined in different directions with respect to the stacking direction of the insulating layers over the plurality of insulating layers, and the mounting region is included in a projection region onto the upper surface of the base through all those through conductors. This wiring board shields reflected X-rays by the plurality of through conductors.

CITATION LIST

Patent Literature

Patent Document 1: Japanese Patent Application Laid-Open No. 2009-32936

SUMMARY OF INVENTION

Technical Problem

In recent years, as radiation detectors for X-ray inspection apparatuses and the like, devices including photoelectric conversion devices such as photodiode arrays having pluralities of two-dimensionally arrayed photoelectric conversion regions and scintillators disposed on the photoelectric conversion devices have been put into practical use. As compared with conventional detectors using X-ray sensitive films, such radiation detectors offer a high level of convenience such as not requiring development and being able to confirm images in real time, and are also excellent in data storage and ease in handling.

In such radiation detectors, the photoelectric conversion device is mounted on a substrate in most cases. Moreover, because it is necessary to amplify minute signals output from the photoelectric conversion device, an integrated circuit device having a plurality of built-in readout circuits such as a plurality of integrator circuits corresponding to the plurality of photoelectric conversion regions is used. The plurality of readout circuits consist of, for example, integrator circuits. It is preferable that the integrated circuit device is mounted on the backside of the substrate for downsizing of the device.

However, when the photoelectric conversion device is mounted on one of the substrate surfaces of the substrate, and the integrated circuit device is mounted on the other substrate surface, the following problem occurs. That is, when radiation made incident into the scintillator is transmitted in part without being absorbed in the scintillator, the radiation may be transmitted through the substrate to reach the integrated circuit device. In the readout circuits of the integrated circuit device, circuit elements that are easily affected by radiation such as, for example, operational amplifiers, capacitors, or switching MOS transistors are included. Hence, radiation having reached the integrated circuit device may cause an abnormality in the circuit elements. Therefore, it is demanded to protect the readout circuits from radiation by some measure.

In the device described in Patent Document 1, a plurality of through conductors are formed inclined in different directions over a plurality of insulating layers. Moreover, as a result of a mounting region being disposed so as to be included in a projection region of these through conductors onto a substrate surface, reflected X-rays are shielded. However, the plurality of through conductors are opposed to each other in such a configuration, and there is a problem of an increase in parasitic capacitance between the through conductors.

It is an object of the present invention to provide a connection substrate for a radiation detector module capable of protecting readout circuits of an integrated circuit device from radiation and suppressing an increase in parasitic capacitance.

Solution to Problem

A connection substrate according to an embodiment of the present invention is a connection substrate for mounting on one substrate surface thereof a photoelectric conversion device for receiving light from a scintillator for converting radiation made incident from a predetermined direction to light at a plurality of photoelectric conversion regions arrayed two-dimensionally, and mounting on the other substrate surface thereof an integrated circuit device for individually reading out by a plurality of readout circuits electrical signals output from each of the plurality of photoelectric conversion regions of the photoelectric conversion device, and includes (a) a base material formed by stacking a plurality of dielectric layers, and (b) a plurality of metallic through conductors provided penetrating through at least three dielectric layers adjacent to each other out of the plurality of dielectric layers, and for serving as a part of paths for the electric signals. In this connection substrate, a plurality of metallic radiation shielding films are provided at two or more interlayer parts in the at least three dielectric layers. The plurality of radiation shielding films are formed integrally with each of the plurality of through conductors and separated from each other. Further, a region obtained by projecting the radiation shielding film formed integrally with one through conductor in one interlayer part onto a virtual plane normal to the predetermined direction and a region obtained by projecting the radiation shielding film formed integrally with another through conductor in another interlayer part onto the virtual plane do not overlap each other.

A connection substrate according to another embodiment of the present invention is a connection substrate for mounting on one substrate surface thereof a photoelectric conversion device for receiving light from a scintillator for converting radiation to light at a plurality of photoelectric conversion regions arrayed two-dimensionally, and mounting on the other substrate surface thereof an integrated circuit device for individually reading out by a plurality of readout circuits electrical signals output from each of the plurality of photoelectric conversion regions of the photoelectric conversion device, and includes (a) a base material formed by stacking a plurality of dielectric layers; and (b) a plurality of metallic through conductors provided penetrating through at least three dielectric layers adjacent to each other out of the plurality of dielectric layers, and for serving as a part of paths for the electric signals. In this connection substrate, a plurality of metallic radiation shielding films are provided at two or more interlayer parts in the at least three dielectric layers. The plurality of radiation shielding films are formed integrally with each of the plurality of through conductors and separated from each other. Further, a region obtained by projecting the radiation shielding film formed integrally with one through conductor in one interlayer part onto a virtual plane parallel to the one substrate surface and a region obtained by projecting the radiation shielding film formed integrally with another through conductor in another interlayer part onto the virtual plane do not overlap each other.

In the connection substrate described above, a plurality of through conductors that penetrate through at least three dielectric layers and a plurality of metallic radiation shielding films formed integrally with each of the plurality of through conductors are provided. In addition, these plurality of radiation shielding films are provided at two or more interlayer parts in the at least three dielectric layers. Due to such a configuration, the plurality of radiation shielding films formed inside the connection substrate protect the readout circuits of the integrated circuit device from radiation.

Moreover, the plurality of radiation shielding films are separated from each other, and a region obtained by projecting the radiation shielding film formed integrally with one through conductor in one interlayer part onto the virtual plane and a region obtained by projecting the radiation shielding film formed integrally with another through conductor in another interlayer part onto the virtual plane do not overlap each other. Here, the virtual plane is a plane normal to the predetermined direction, which is the radiation incident direction, or when the radiation incident direction is normal to the substrate surfaces of the connection substrate, it is a plane parallel to one of the substrate surfaces of the connection substrate. Accordingly, the radiation shielding films formed integrally with each of the one through conductor and another through conductor are not opposed to each other, so that a parasitic capacitance to be generated between the one through conductor and another through conductor can be reduced.

As described in the above, by the connection substrate described above, the readout circuits of the integrated circuit device can be protected from radiation, and an increase in parasitic capacitance can be suppressed.

Moreover, in the above-described connection substrate, an interlayer wiring caused by a difference between an electrode pitch of the photoelectric conversion device and a pitch of the plurality of through conductors may be provided, out of the interlayer parts in the plurality of dielectric layers, at one or two or more interlayer parts located closer to the one substrate surface relative to the at least three dielectric layers.

Moreover, in the above-described connection substrate, each radiation shielding film may be extended around each corresponding through conductor.

Advantageous Effects of Invention

By the present invention, a connection substrate for a radiation detector module capable of protecting readout circuits of an integrated circuit device from radiation and suppressing an increase in parasitic capacitance can be provided.

DESCRIPTION OF EMBODIMENTS

Hereinafter, embodiments of a connection substrate according to the present invention will be described in detail with reference to the accompanying drawings. Also, the same elements will be denoted with the same reference signs in the description of drawings, and overlapping description will be omitted.

Figure 1:
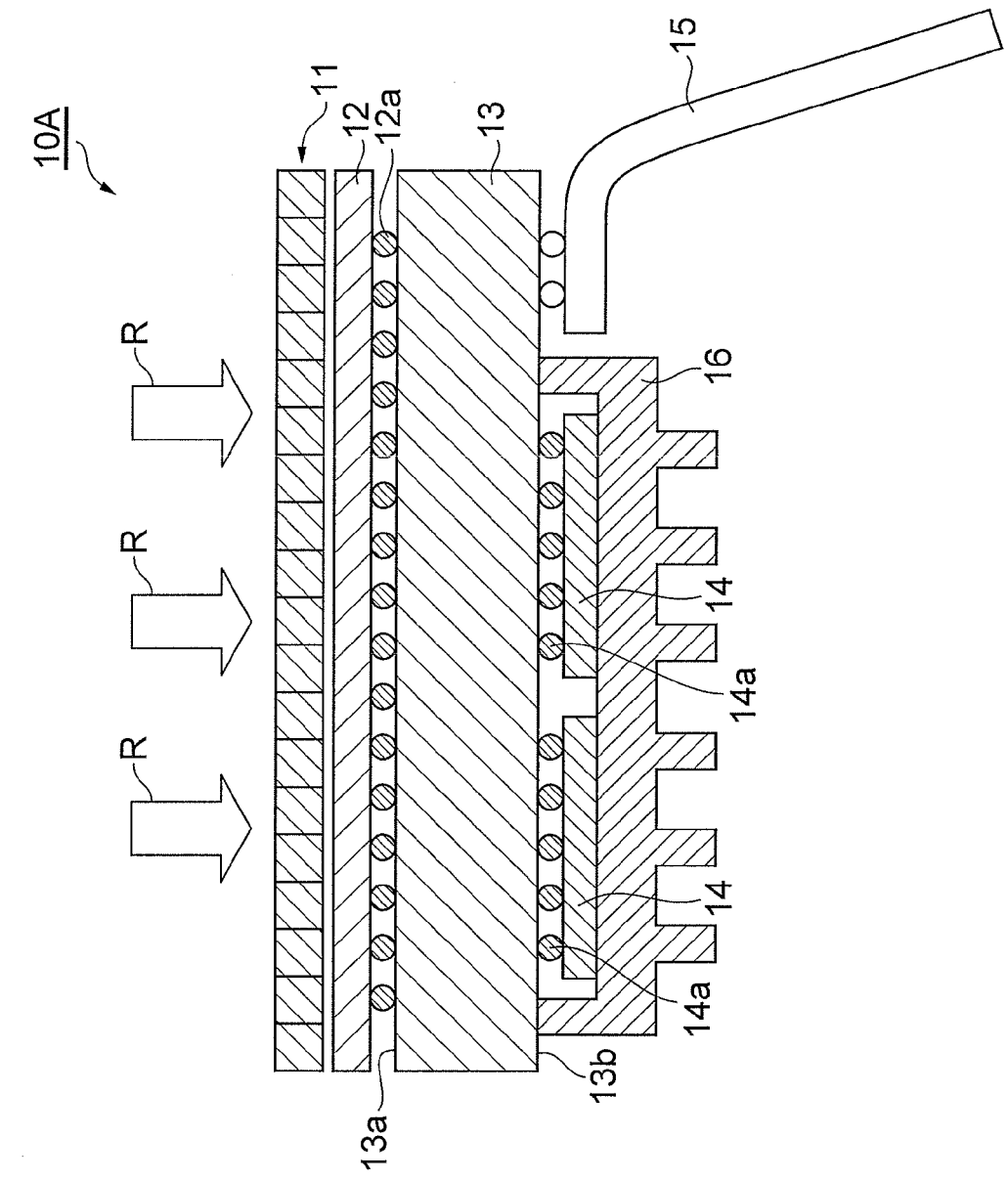
FIG. 1 is a sectional view showing a configuration of a radiation detector module including an connection substrate according to an embodiment.

FIG. 1 is a sectional view showing a configuration of a radiation detector module including a connection substrate according to an embodiment. The radiation detector module 10A shown in FIG. 1 includes a scintillator 11, a photodiode array 12, a connection substrate 13, and an integrated circuit device 14.

The scintillator 11 is a plate-shaped member for converting radiation R made incident from a predetermined direction to light. The radiation R is, for example, X-rays. The scintillator 11 is divided into a plurality of pixels arrayed in M rows and N columns, and disposed on a light incident surface of the two-dimensional photodiode array 12. N and M are both integers not less than 2. The scintillator 11 produces scintillation light in response to the incident radiation R to convert a radiation image into a light image, and outputs the light image to the two-dimensional photodiode array 12. The scintillator 11 is made of, for example, CsI. The scintillator 11 can be placed so as to cover the two-dimensional photodiode array 12, or can be provided by vapor deposition on the two-dimensional photodiode array 12.

The two-dimensional photodiode array 12 serves as a photoelectric conversion device in the present embodiment. The two-dimensional photodiode array 12 has a plurality of photodiodes as a plurality of photoelectric conversion regions arrayed two-dimensionally such as in M rows and N columns, and receives light from the scintillator 11 at the plurality of photodiodes. The two-dimensional photodiode array 12 has a plurality of bump electrodes 12a, which is a conductive bonding material for so-called flip-chip bonding, on a back surface on the opposite side to the light incident surface, and these plurality of bump electrodes 12a are arrayed two-dimensionally such as in M rows and N columns on the back surface of the two-dimensional photodiode array 12. The two-dimensional photodiode array 12 has planar dimensions of, for example, 20 mm×35 mm.

The connection substrate 13 is mounted with the two-dimensional photodiode array 12 on one substrate surface 13a, and is mounted with the integrated circuit device 14 to be described later on the other substrate surface 13b. The connection substrate 13 is formed by stacking a plurality of dielectric layers, and has an internal wiring for electrical connection between the two-dimensional photodiode array 12 and the integrated circuit device 14. Moreover, on the one substrate surface 13a of the connection substrate 13, a plurality of land-shaped wirings to mount the two-dimensional photodiode array 12 are arrayed two-dimensionally such as in M rows and N columns, and on the other substrate surface 13b, a plurality of land-shaped wirings to mount the integrated circuit device 14 are arrayed two-dimensionally.

The integrated circuit device 14 individually detects electrical signals such as a photoelectric current output from each of the plurality of photodiodes of the two-dimensional photodiode array 12 to thereby read out these electric signals. The integrated circuit device 14 has a structure for which a plurality of readout circuits corresponding to the plurality of photodiodes of the two-dimensional photodiode array 12 are collectively packaged into a chip. Moreover, a plurality of bump electrodes 14a as a conductive bonding material to serve as input terminals to these plurality of readout circuits are arrayed two-dimensionally on a surface of the integrated circuit device 14 opposed to the connection substrate 13.

Moreover, the radiation detector module 10A further includes a flexible printed board 15 to externally output an electrical signal output from the integrated circuit device 14. One end of the flexible printed board 15 is electrically connected onto the other substrate surface 13b of the connection substrate 13.

Moreover, the radiation detector module 10A further includes a heat sink 16 to cool the integrated circuit device 14. The heat sink 16 is in contact with a surface of the integrated circuit device 14 on the opposite side to the surface opposed to the connection substrate 13, and has a shape of a large number of fins projecting to the outside.

Figure 2:
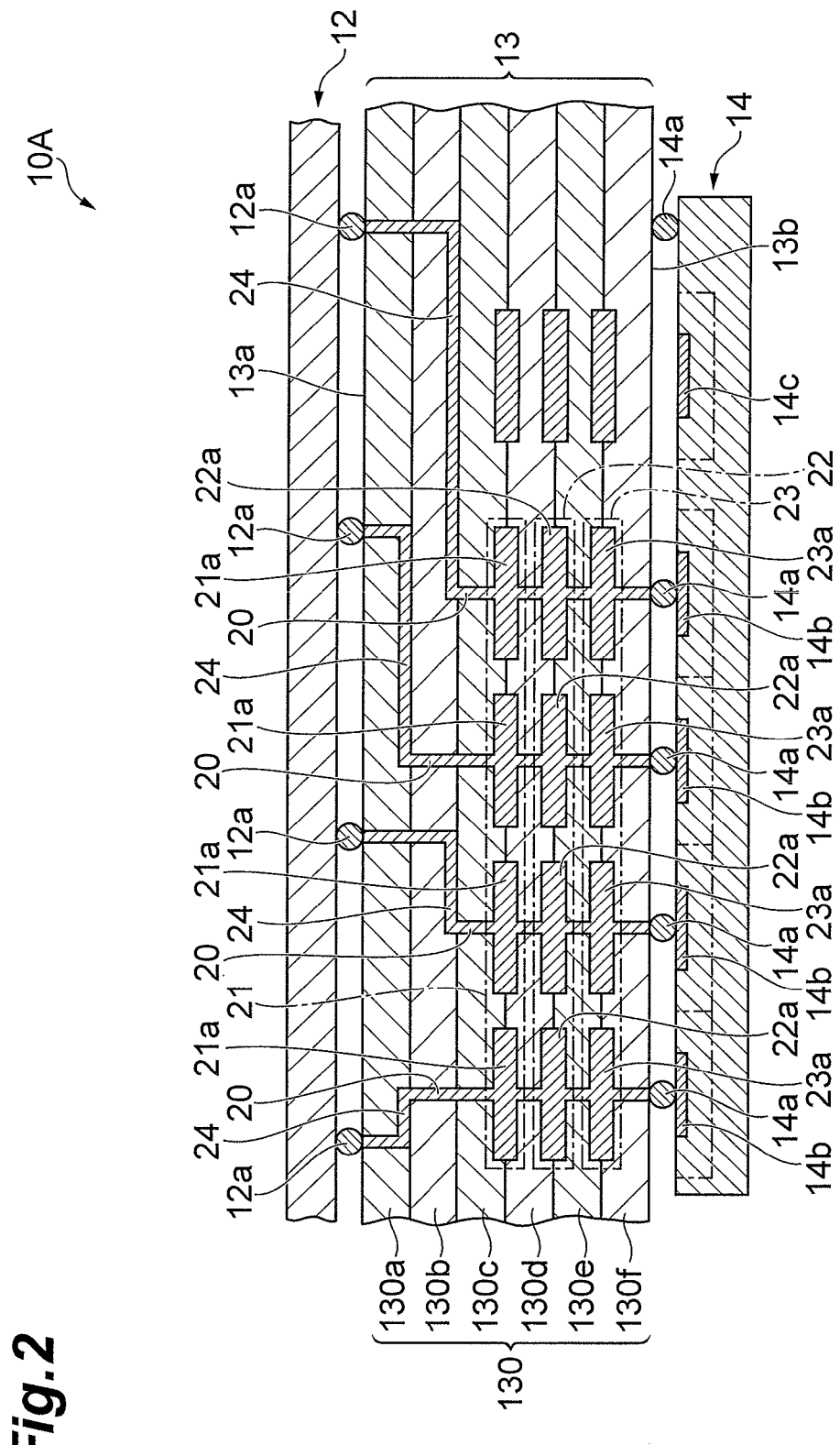
FIG. 2 is a sectional view showing an internal configuration of a connection substrate and integrated circuit device.

FIG. 2 is a sectional view showing an internal configuration of the connection substrate 13 and the integrated circuit device 14. In the same figure, there is illustrated a two-dimensional photodiode array 12, but illustration of a scintillator 11 and a heat sink 16 is omitted.

As shown in FIG. 2, the integrated circuit device 14 has a plurality of unit circuit regions 14b and a plurality of circuit regions 14c. In the plurality of unit circuit regions 14b, a plurality of front-stage amplifiers are respectively included as a plurality of readout circuits. These plurality of readout circuits respectively correspond to the plurality of photodiodes of the two-dimensional photodiode array 12, and respectively receive electrical signals such as photoelectric currents from the corresponding photodiodes. In the circuit region 14c, a rear-stage amplifier is provided as an amplifier circuit to further amplify a signal output from the readout circuit of the unit circuit region 14b.

Figure 3:
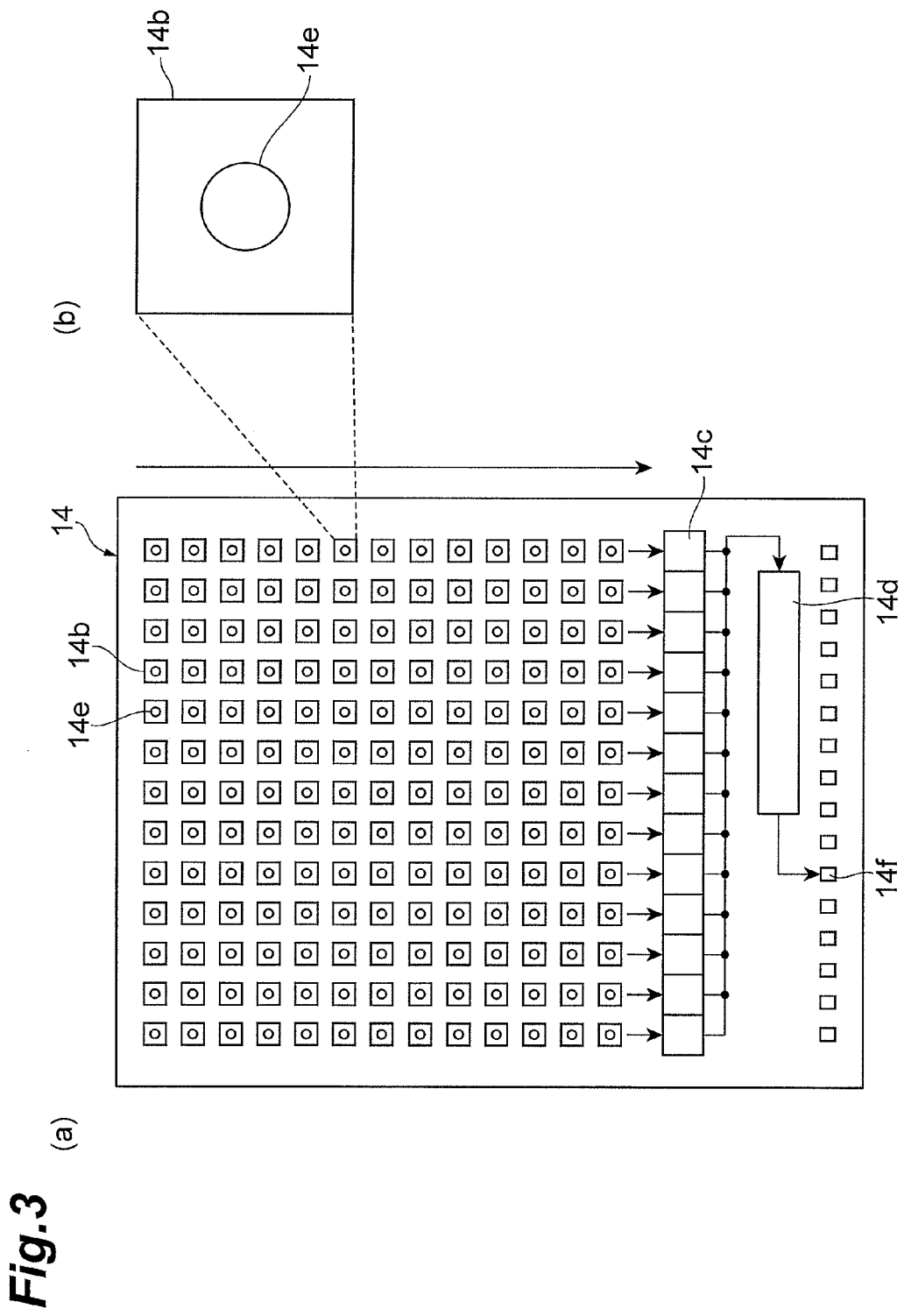
FIG. 3 shows an arrangement of structural elements of an integrated circuit viewed from an incident direction of radiation.

Here, Part (a) of FIG. 3 is a view showing a configuration example of the integrated circuit device 14. Part (a) of FIG. 3 shows an arrangement of the structural elements of the integrated circuit device 14 viewed from an incident direction of radiation R. Part (b) of FIG. 3 is a view showing one of the unit circuit regions 14b of the integrated circuit device 14 in an enlarged manner. The integrated circuit device 14 has a size of, for example, 9 mm×11 mm.

As shown in Part (a) of FIG. 3, the unit circuit regions 14b are arrayed two-dimensionally in J rows and K columns in the interior of the integrated circuit device 14. J and K are integers not less than 2. In each unit circuit region 14b, an input pad 14e is provided as shown in Part (b) of FIG. 3. On the input pad 14e, the bump electrode 14a shown in FIG. 1 is provided. Moreover, these unit circuit regions 14b are separated from each other, and between one unit circuit region 14b and other unit circuit regions 14b, a region where no circuit elements such as transistors and capacitors exist extends in the row direction and column direction. However, in this region, a metal wiring to connect circuit elements to each other may exist. A single unit circuit region 14b has dimensions of, for example, 0.5 mm in the row direction and 0.5 mm in the column direction, and the gap interval between the neighboring unit circuit regions 14b is, for example, 0.16 mm.

K circuit regions 14c are disposed corresponding to the columns of the unit circuit regions 14b. These circuit regions 14c are disposed aligned in the row direction, and their input ends are electrically connected with the unit circuit regions 14b of the corresponding columns, respectively.

In the front-stage amplifier as a readout circuit included in the unit circuit region 14b and the rear-stage amplifier as an amplifier circuit included in the circuit region 14c, switches are individually provided. Designation of a row to be read out can be performed by using the switch of the readout circuit of the unit circuit region 14b, and designation of a column to be read out can be performed by using the switch of the amplifier circuit of the circuit region 14c.

Output ends of the K circuit regions 14c are electrically connected with an A/D converter 14d. The A/D converter 14d converts an analog signal output from each circuit region 14c to a digital signal. The digital signal output from the A/D converter 14d is output to the outside of the integrated circuit device 14 via one of the plurality of input/output pads 14f arrayed along an edge of the integrated circuit device 14. Other input/output pads 14f are used for power supply voltage input, input of a reference potential such as a ground potential, clock input, and the like.

Figure 4:
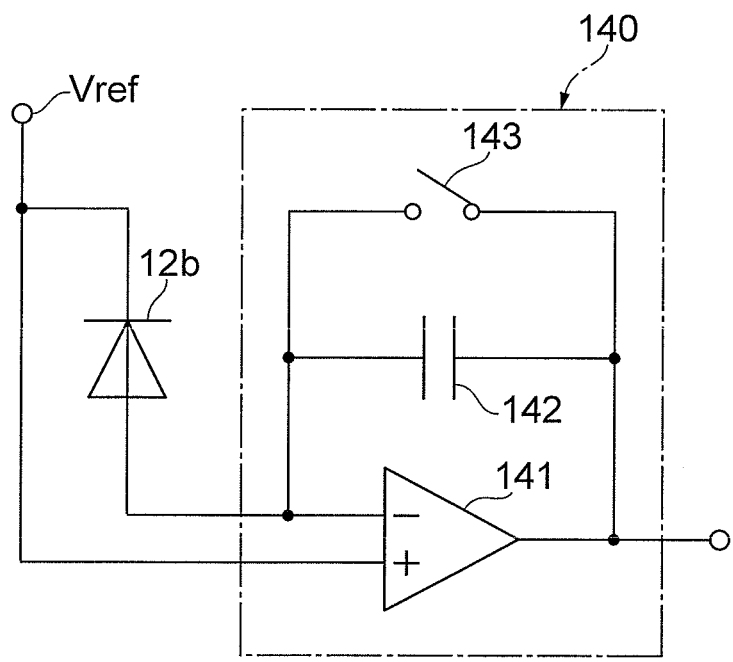
FIG. 4 is an equivalent circuit diagram showing a configuration example of a readout circuit.

FIG. 4 is an equivalent circuit showing a configuration example of the readout circuit included in each unit circuit region 14b. In this equivalent circuit, the readout circuit 140 consists of an integrator circuit, and includes an operational amplifier 141, a capacitor 142 as a feedback capacitance, and a reset switch 143. A non-inverting input terminal of the operational amplifier 141 is connected to a reference voltage Vref, and an inverting input terminal of the operational amplifier 141 is connected to an anode of one of the photodiodes 12b included in the two-dimensional photodiode array 12 shown in FIG. 1. A cathode of the photodiode 12b is connected to the reference voltage Vref, and a reverse bias is applied to the photodiode 12b.

The capacitor 142 is connected between the inverting input terminal and output terminal of the operational amplifier 141. In the capacitor 142, a charge due to a photoelectric current output from the photodiode 12b is accumulated. The reset switch 143 is connected in parallel to the capacitor 142, and resets the charge accumulated in the capacitor 142. The reset switch 143 is suitably realized by, for example, a MOS transistor.

Referring again to FIG. 2, the connection substrate 13 will be described in detail. The connection substrate 13 of the present embodiment has a base material 130 formed by stacking a plurality of dielectric layers 130a to 130f. In FIG. 2, six dielectric layers 130a to 130f are shown. The dielectric layers 130a to 130f of the base material 130 are formed of, for example, a ceramic substrate made mainly from a ceramic material such as alumina. The thickness of each of the dielectric layers 130a to 130f is, for example, not less than 100 μm and not more than 200 μm.

Moreover, the connection substrate 13 has a plurality of through conductors 20. The through conductor 20 is provided penetrating through at least three dielectric layers 130c to 130f adjacent to each other out of the dielectric layers 130a to 130f. In one example, the through conductor 20 is provided penetrating through four dielectric layers 130c to 130f. Each of the plurality of through conductors 20 corresponds one-to-one to each of the plurality of photodiodes of the two-dimensional photodiode array 12, and serves as a part of a path for a photoelectric current output from the photodiode. The through conductor 20 is made of, for example, a metal material such as tungsten, and is formed by the metal material being implanted into a through-hole formed in the dielectric layers 130c to 130f. In the present embodiment, the pitch of the neighboring through conductors 20 is equal to the pitch between the unit circuit regions 14b of the integrated circuit device 14, so that each through conductor 20 is located immediately above the corresponding unit circuit region 14b. The pitch of the neighboring through conductors 20 is, for example, 500 μm. Moreover, the diameter of the through conductors 20 is, for example, 100 μm.

Moreover, the connection substrate 13 has a plurality of radiation shielding film groups 21 to 23 provided at two or more interlayer parts in the at least three dielectric layers 130c to 130f. In FIG. 2, the plurality of radiation shielding film groups 21 to 23 are provided at three interlayer parts in four dielectric layers 130c to 130f. Specifically, the radiation shielding film group 21 is provided at an interlayer part between the dielectric layers 130c and 130d, the radiation shielding film group 22 is provided at an interlayer part between the dielectric layers 130d and 130e, and the radiation shielding film group 23 is provided at an interlayer part between the dielectric layers 130e and 130f.

Each of the radiation shielding film groups 21 to 23 includes a plurality of metallic radiation shielding films corresponding to the number of through conductors 20. That is, the radiation shielding film group 21 includes the same number of radiation shielding films 21a as that of the through conductors 20, the radiation shielding film group 22 includes the same number of radiation shielding films 22a as that of the through conductors 20, and the radiation shielding film group 23 includes the same number of radiation shielding films 23a as that of the through conductors 20. These radiation shielding films 21a to 23a are formed integrally with their corresponding through conductors 20, and extended around said through conductors 20.

In the respective radiation shielding film groups 21 to 23, the radiation shielding films are separated from each other. That is, the plurality of radiation shielding films 21a are provided at intervals from each other in one interlayer part, the plurality of radiation shielding films 22a are provided at intervals from each other in another interlayer part, and the plurality of radiation shielding films 23a are provided at intervals from each other in still another interlayer part. Thereby, the through conductors 20 are electrically isolated.

The planar shape of the radiation shielding films 21a is, for example, a regular square of 400 μm square. Moreover, the interval of the neighboring radiation shielding films 21a is, for example, 100 μm, and the thickness of the radiation shielding films 21a is, for example, 10 μm. The shape and dimensions are the same as for the radiation shielding films 22a, 23a. As the constituent material of the radiation shielding films 21a to 23a, for example, tungsten is suitable. The radiation shielding films 21a to 23a can be easily formed by the same method as the method for forming so-called via lands at interlayer parts between the dielectric layers 130c to 130f.

Moreover, the connection substrate 13 further has a plurality of interlayer wirings 24. The interlayer wiring 24 is a wiring caused by a difference between the electrode pitch of the two-dimensional photodiode array 12 and the pitch of the plurality of through conductors 20. The interlayer wiring 24 is provided, out of the interlayer parts in the plurality of dielectric layers 130a to 130f, at one or two or more interlayer parts located closer to the one substrate surface 13a relative to the dielectric layers 130c to 130f provided with the radiation shielding films 21a to 23a. In FIG. 2, the interlayer wiring 24 is provided at an interlayer part between the dielectric layer 130a and the dielectric layer 130b, and at an interlayer part between the dielectric layer 130b and the dielectric layer 130c.

Here, description will be given of a relative positional relationship between the radiation shielding films 21a to 23a of the connection substrate 13 and the plurality of unit circuit regions 14b of the integrated circuit device 14. For this description, the concept of a virtual plane to project the radiation shielding films and unit circuit regions will be introduced. The virtual plane is defined as a plane normal to a predetermined direction, which is the incident direction of radiation R shown in FIG. 1. Alternatively, when said incident direction is substantially normal to the substrate surfaces 13a, 13b of the connection substrate 13, the virtual plane may be defined as a plane parallel to the substrate surface 13a or 13b.

Figure 5:
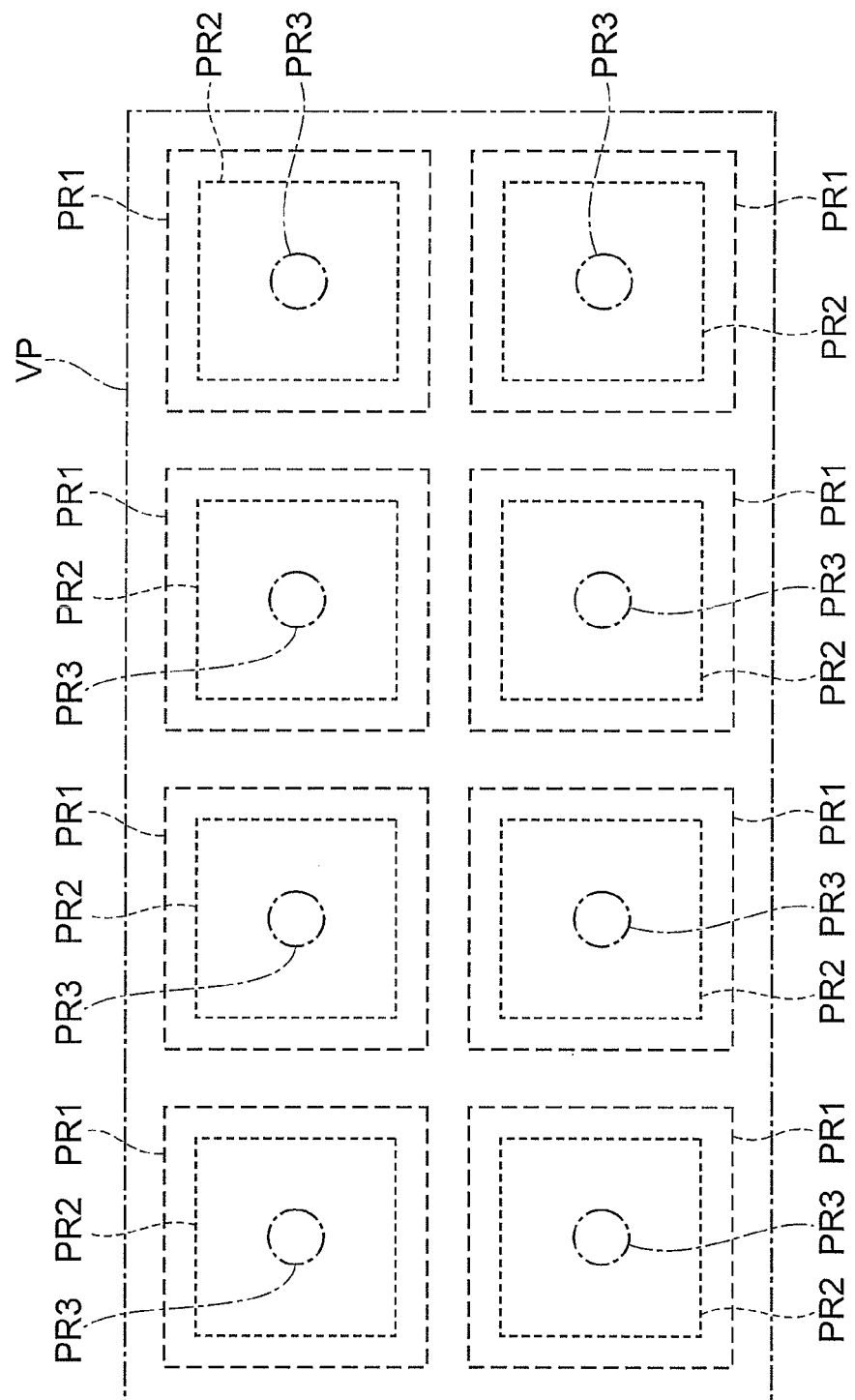
FIG. 5 is a view showing projection of radiation shielding films and unit circuit regions onto a virtual plane.

FIG. 5 is a view showing projection of the pluralities of radiation shielding films 21a to 23a of the connection substrate 13 and the plurality of unit circuit regions 14b of the integrated circuit device 14 onto a virtual plane VP. In FIG. 5, reference sign PR1 denotes regions obtained by projecting the pluralities of radiation shielding films 21a to 23a onto the virtual plane VP. Reference sign PR2 denotes regions obtained by projecting the plurality of unit circuit regions 14b onto the virtual plane VP. Reference sign PR3 denotes regions obtained by projecting the plurality of through conductors 20 onto the virtual plane VP.

As shown in FIG. 5, the plurality of regions PR1 are separated from each other, and do not overlap each other. These regions PR1 are projection regions common to the radiation shielding films 21a to 23a. That is, the region PR1 for the radiation shielding film 21a formed integrally with one through conductor 20 in one interlayer part and the region PR1 for the radiation shielding film 21b or 21c formed integrally with another through conductor 20 in another interlayer part do not overlap each other. Moreover, the region PR1 for the radiation shielding film 21b formed integrally with one through conductor 20 in one interlayer part and the region PR1 for the radiation shielding film 21c formed integrally with another through conductor 20 in another interlayer part do not overlap each other. Accordingly, the radiation shielding films 21a to 23a formed integrally with one through conductor 20 and the radiation shielding film 21a to 23a formed integrally with another through conductor 20 are not opposed to each other, so that a parasitic capacitance to be generated between the plurality of through conductors 20 can be reduced. Therefore, noise to be superimposed on electrical signals such as photoelectric currents output from the plurality of photodiodes of the two-dimensional photodiode array 12 can be reduced.

Moreover, in the connection substrate 13 of the present embodiment, each of the pluralities of radiation shielding films 21a to 23a protects each corresponding unit circuit region 14b from radiation. Moreover, radiation R that has passed through the gaps between the pluralities of radiation shielding films 21a to 23a can reach the integrated circuit device 14, but no unit circuit regions 14b exist at that part of arrival, so that there is little influence from the radiation R.

Thus, according to the connection substrate 13 of the present embodiment, the readout circuits of the integrated circuit device 14 can be protected from radiation, and an increase in parasitic capacitance can be suppressed.

Moreover, in the connection substrate 13 of the present embodiment, each of the plurality of radiation shielding films 21a is formed integrally with the corresponding through conductor 20. The same applies to the pluralities of radiation shielding films 22a and 23a. Thus, the radiation shielding films 21a to 23a formed integrally with the through conductors 20 do not obstruct arrangement of the through conductors 20, so that it is not necessary to form a complicated wiring such as to bypass a radiation shield.

Moreover, as shown in FIG. 5, in the connection substrate 13 of the present embodiment, each of the plurality of regions PR1 obtained by projecting the pluralities of radiation shielding films 21a to 23a onto the virtual plane VP includes each of the plurality of regions PR2 obtained by projecting the plurality of unit circuit regions 14b onto the virtual plane VP. In other words, when viewed from the incident direction of radiation R or a direction normal to the substrate surface 13a, the plurality of unit circuit regions 14b are completely covered with the plurality of radiation shielding films 21a. The same applies to the plurality of radiation shielding films 22a and the plurality of radiation shielding films 23a. The radiation shielding films 21a to 23a of the connection substrate 13 may be disposed as such, and the readout circuits of the integrated circuit device 14 can thereby be protected from radiation more effectively.

Moreover, as in the above-described embodiment, the radiation shielding films 21a to 23a may be extended around corresponding through conductors 20. Accordingly, each of the radiation shielding films 21a to 23a can suitably protect each corresponding unit circuit region 14b from radiation.

The connection substrate according to the present invention is not limited to the embodiment described above, and various other modifications can be made. For example, in the above-described embodiment, the radiation shielding films 21a to 23a are provided at the three interlayer parts in the four dielectric layers 130c to 130f, but radiation shielding films can provide the same effects as those in the above-described embodiment by being provided at two or more interlayer parts in at least three dielectric layers.

INDUSTRIAL APPLICABILITY

The present invention can be applied as a connection substrate for a radiation detector module capable of protecting readout circuits of an integrated circuit device from radiation and suppressing an increase in parasitic capacitance.

REFERENCE SIGNS LIST

10A: radiation detector module, 11: scintillator, 12: two-dimensional photodiode array, 12a: bump electrode, 12b: photodiode, 13: connection substrate, 13a, 13b: substrate surface, 14: integrated circuit device, 14a: bump electrode, 14b: unit circuit region, 14c: circuit region, 14d: A/D converter, 14e: input pad, 14f: input/output pad, 15: flexible printed board, 16: heat sink, 20: through conductor, 21, 22, 23: radiation shielding film group, 21a, 22a, 23a: radiation shielding film, 24: interlayer wiring, 130: base material, 130a-130f: dielectric layer, 140: readout circuit, 141: operational amplifier, 142: capacitor, 143: reset switch.

The invention claimed is:

1. A connection substrate for mounting on one substrate surface thereof a photoelectric conversion device for receiving light from a scintillator for converting radiation made incident from a predetermined direction to light at a plurality of photoelectric conversion regions arrayed two-dimensionally, and mounting on the other substrate surface thereof an integrated circuit device for individually reading out by a plurality of readout circuits electrical signals output from each of the plurality of photoelectric conversion regions of the photoelectric conversion device, comprising:

a base material formed by stacking a plurality of dielectric layers; and a plurality of metallic through conductors provided penetrating through at least three dielectric layers adjacent to each other out of the plurality of dielectric layers, and for serving as a part of paths for the electric signals, wherein a plurality of metallic radiation shielding films formed integrally with each of the plurality of through conductors and separated from each other are provided at two or more interlayer parts in the at least three dielectric layers, and a region of the radiation shielding film formed integrally with one through conductor in one interlayer part projected onto a virtual plane normal to the predetermined direction and a region of another radiation shielding film not formed integrally with said through conductor in said interlayer part projected onto the virtual plane do not overlap each other.

2. The connection substrate according to claim 1, wherein an interlayer wiring caused by a difference between an electrode pitch of the photoelectric conversion device and a pitch of the plurality of through conductors is provided, out of the interlayer parts in the plurality of dielectric layers, at one or two or more interlayer parts located closer to the one substrate surface relative to the at least three dielectric layers.

3. The connection substrate according to claim 1, wherein each radiation shielding film is extended around each corresponding through conductor.

4. A connection substrate for mounting on one substrate surface thereof a photoelectric conversion device for receiving light from a scintillator for converting radiation to light at a plurality of photoelectric conversion regions arrayed two-dimensionally, and mounting on the other substrate surface thereof an integrated circuit device for individually reading out by a plurality of readout circuits electrical signals output from each of the plurality of photoelectric conversion regions of the photoelectric conversion device, comprising:

a base material formed by stacking a plurality of dielectric layers; and a plurality of metallic through conductors provided penetrating through at least three dielectric layers adjacent to each other out of the plurality of dielectric layers, and for serving as a part of paths for the electric signals, wherein a plurality of metallic radiation shielding films formed integrally with each of the plurality of through conductors and separated from each other are provided at two or more interlayer parts in the at least three dielectric layers, and a region of the radiation shielding film formed integrally with one through conductor in one interlayer part projected onto a virtual plane parallel to the one substrate surface and a region of another radiation shielding film not formed integrally with said through conductor in said interlayer part projected onto the virtual plane do not overlap each other.

5. The connection substrate according to claim 4, wherein an interlayer wiring caused by a difference between an electrode pitch of the photoelectric conversion device and a pitch of the plurality of through conductors is provided, out of the interlayer parts in the plurality of dielectric layers, at one or two or more interlayer parts located closer to the one substrate surface relative to the at least three dielectric layers.

6. The connection substrate according to claim 4, wherein each radiation shielding film is extended around each corresponding through conductor.

* * * * *